US012771094B2

(12) United States Patent
Wakaba et al.

(10) Patent No.: US 12,771,094 B2
(45) Date of Patent: Oct. 20, 2026

(54) SEMICONDUCTOR DEVICE

(71) Applicant: FURUKAWA ELECTRIC CO., LTD., Tokyo (JP)

(72) Inventors: Masaki Wakaba, Tokyo (JP); Kazuomi Maruyama, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 1126 days.

(21) Appl. No.: 17/814,112

(22) Filed: Jul. 21, 2022

(65) Prior Publication Data

US 2022/0360040 A1 Nov. 10, 2022

Related U.S. Application Data

(63) Continuation of application No. PCT/JP2021/001517, filed on Jan. 18, 2021.

(30) Foreign Application Priority Data

Jan. 22, 2020 (JP) ................................ 2020-008156

(51) Int. Cl.

| | |
|---|---|
| ***H01S 5/024*** | (2006.01) |
| ***H01S 5/026*** | (2006.01) |
| ***H01S 5/10*** | (2021.01) |
| ***H01S 5/227*** | (2006.01) |
| *H01S 5/068* | (2006.01) |

(52) U.S. Cl.

CPC .......... *H01S 5/02453* (2013.01); *H01S 5/026* (2013.01); *H01S 5/1007* (2013.01); *H01S 5/227* (2013.01); *H01S 5/068* (2013.01)

(58) Field of Classification Search

CPC ..................................................... H01S 5/0261

See application file for complete search history.

(56) References Cited

U.S. PATENT DOCUMENTS

2007/0230523 A1* 10/2007 Ishikawa ............... H01S 5/0265 372/50.1
2013/0209021 A1 8/2013 Hayashi et al.
2013/0343417 A1 12/2013 Takagi (Continued)

FOREIGN PATENT DOCUMENTS

CN 103515841 A 1/2014
CN 105229523 A 1/2016

(Continued)

OTHER PUBLICATIONS

English Translation of Higa (Year: 2017).*

(Continued)

*Primary Examiner* — Minsun O Harvey
(74) *Attorney, Agent, or Firm* — Oblon, McClelland, Maier & Neustadt, L.L.P.

(57) ABSTRACT

A semiconductor device includes: a base including a base surface; a mesa protruding from the base surface in a first direction intersecting the base surface, the mesa including a top surface and two side surfaces on both sides of the top surface, and extending along the base surface; and an electric resistor including a top wall provided on the top surface and a side wall provided on at least one of the two side surfaces, the electric resistor being configured such that a current flows in an extending direction of the mesa.

18 Claims, 10 Drawing Sheets

(56) References Cited

U.S. PATENT DOCUMENTS

| | | | |
|---|---|---|---|
| 2016/0079727 | A1 | 3/2016 | Takabayashi et al. |
| 2017/0194764 | A1 | 7/2017 | Evans et al. |
| 2018/0286985 | A1 | 10/2018 | Hara |
| 2019/0363516 | A1 | 11/2019 | Higa et al. |

FOREIGN PATENT DOCUMENTS

| | | | | |
|---|---|---|---|---|
| CN | 108028202 | A | | 5/2018 |
| CN | 110249245 | A | | 9/2019 |
| JP | 2003-347562 | A | | 12/2003 |
| JP | 2006-259104 | A | | 9/2006 |
| JP | 2010-237296 | A | | 10/2010 |
| JP | 2013-168440 | A | | 8/2013 |
| JP | 2013-172026 | A | | 9/2013 |
| JP | 2016-54168 | A | | 4/2016 |
| JP | 2017161830 | A | * | 9/2017 |
| KR | 10-2013-0048408 | A | | 5/2013 |
| WO | WO 2018-147307 | A1 | | 8/2018 |

OTHER PUBLICATIONS

English Translation of Iwai (Year: 2017).*

International Search Report issued Mar. 23, 2021 in PCT/JP2021/001517, filed on Jan. 18, 2021, 3 pages.

Combined Chinese Office Action and Search Report issued Jul. 29, 2023 in Chinese Patent Application No. 202180010392.8, with English translation of the Office Action only, 17 pgs.

* cited by examiner

SEMICONDUCTOR DEVICE

This application is a continuation of International Application No. PCT/JP2021/001517, filed on Jan. 18, 2021 which claims the benefit of priority of the prior Japanese Patent Application No. 2020-008156, filed on Jan. 22, 2020, the entire contents of which are incorporated herein by reference.

BACKGROUND

The disclosure relates to a semiconductor device.

A semiconductor device including a heater on a mesa has been known (Japanese Laid-open Patent Publication No. 2016-05416)

SUMMARY

In a semiconductor device provided with a heater on a mesa like one according to Japanese Laid-open Patent Publication No. 2016-05416, it is not preferable that the temperature of the semiconductor device excessively increase locally because of heating by the heater.

There is a need for a semiconductor device including a heater on a mesa which is able to inhibit a local and excessive temperature increase.

According to the present disclosure, there is provided a semiconductor device including: a base including a base surface; a mesa protruding from the base surface in a first direction intersecting the base surface, the mesa including a top surface and two side surfaces on both sides of the top surface, and extending along the base surface; and an electric resistor including a top wall provided on the top surface and a side wall provided on at least one of the two side surfaces, the electric resistor being configured such that a current flows in an extending direction of the mesa.

DETAILED DESCRIPTION

Figure 1:
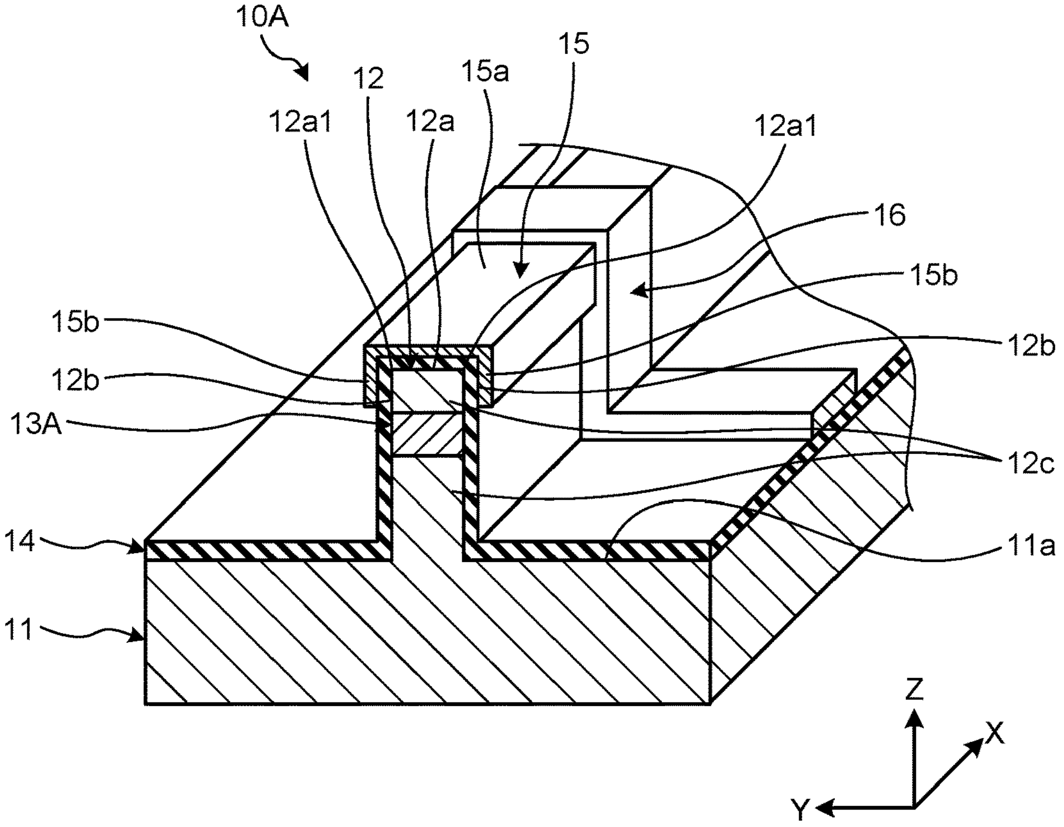
FIG. 1 is an exemplary and schematic perspective view of a semiconductor device of a first embodiment, containing partial cross-sections.

Exemplary embodiments and modifications of the disclosure will be disclosed below. Configurations of the embodiments and the modifications that are presented below and functions and results (effects) caused by the configurations are an example. The disclosure may be realized also by configurations other than those disclosed in the following embodiments and modifications. According to the disclosure, it is possible to obtain at least one of various effects (including derivative effects) that are obtained by the configurations.

The embodiments and modifications presented below have similar configurations. Thus, according to each of the embodiments and the modifications, similar functions and effects based on the similar configurations are obtained. Similar reference numerals are assigned to the similar configurations and redundant description is sometimes omitted below.

In the specification, ordinal numbers are assigned for convenience in order to distinguish parts, portions, etc., and do not represent priorities and an order.

In each of the drawings, an X-direction is denoted with an arrow X, a Y-direction is denoted with an arrow Y and a Z-direction is denoted with an arrow Z. The X-direction, the Y-direction and the Z-direction intersect one another and are orthogonal to one another. The X-direction is also referred to as a longitudinal direction or an extension direction, the Y-direction is also referred to as a transverse direction, a width direction or a thickness direction, and the Z-direction is also referred to as a height direction or a protrusion direction.

First Embodiment

FIG. 1 is a perspective view of a semiconductor device 10A of a first embodiment, containing partial cross-sections. FIG. 1 illustrates a cross-section orthogonal to the X-direction and a cross-section orthogonal to the Y-direction together with the perspective form.

As illustrated in FIG. 1, the semiconductor device 10A includes a substrate 11, a mesa 12, a waveguide layer 13A, a dielectric layer 14, an electric resistor 15, and a conductor layer 16.

The substrate 11 is a semiconductor substrate. The substrate 11 spreads, intersecting the Z-direction. In the present embodiment, the substrate 11 extends in the X-direction and the Y-direction and is orthogonal to the Z-direction. The substrate 11 includes a base surface 11*a*. The base surface 11*a* has a planar shape and spreads, intersecting the Z-direction. In the present embodiment, the base surface 11*a* extends in the X-direction and the Y-direction and is orthogonal to the Z-direction. The substrate 11 is an example of a base. The base surface 11*a* may be also referred to as a surface.

The substrate 11 may be made of, for example, n-type indium phosphide (InP).

The mesa 12 protrudes in the Z-direction in an approximately a certain width from the base surface 11*a*. The mesa 12 extends in the X-direction in an approximately certain height in the Z-direction. In other words, the mesa 12 has a shape like a wall protruding above the base surface 11*a* and extending along the base surface 11*a*. The mesa 12 may extend along the base surface 11*a* while curving. The width of the mesa 12 may vary in the Z-direction, that is, the height direction, or may vary along the X-direction, that is, the extension direction. The Z-direction is an example of a first direction.

The mesa 12 includes a top surface 12*a* and two side surfaces 12*b*.

The top surface 12*a* spreads, intersecting the Z-direction. In the first embodiment, the top surface 12*a* extends in the X-direction and the Y-direction and is orthogonal to the Z-direction. The top surface 12*a* is approximately parallel to the base surface 11*a*. The top surface 12*a* extends in the X-direction in an approximately certain width in the Y-direction. The top surface 12*a* may extend approximately in parallel with the base surface 11*a* while curving. The width of the top surface 12*a* may vary along the direction of extension of the mesa 12.

Each of the side surfaces 12*b* is present between an end edge 12*a*1 of the top surface 12*a* in the width direction and the base surface 11*a*. In other words, the side surface 12*b* extends from the end edge 12*a*1 toward a direction opposite to the Z-direction, that is, toward the base surface 11*a*. The side surface 12*b* is along the Z-direction and extends in the Z-direction. The side surface 12*b* extends in the X-direction in an approximately certain width in the Z-direction. The side surface 12*b* may extend along the base surface 11*a* while curving.

In the mesa 12, the waveguide layer 13A that guides light, that is, the waveguide layer 13A for light is provided. The semiconductor device 10A has a so-called high-mesa configuration. The waveguide layer 13A is positioned between the base of the mesa 12 and the top surface 12*a*. The waveguide layer 13A extends in the X-direction in an approximately certain width in the Y-direction and at an approximately certain level in the Z-direction. The waveguide layer 13A may extend approximately in parallel with the base surface 11*a* while curving together with the mesa 12.

The waveguide layer 13A penetrates between the side surfaces 12*b* of the mesa 12 in the first embodiment.

The mesa 12 containing the waveguide layer 13A may be made by a known semiconductor manufacturing process. Portions of the mesa 12 excluding the waveguide layer 13A functions as a cladding layer 12*c* with respect to the waveguide layer 13A. The cladding layer 12*c* may be made of a material with a refractive index lower than that of a material of the waveguide layer 13A. For example, when a wavelength of light that the waveguide layer 13A guides is 1.55 μm, the cladding layer 12*c* may be made of InP and the waveguide layer 13A may be made of InGaAsP. Note that the materials of the cladding layer 12*c* and the waveguide layer 13A are not limited to this example, and the materials may be set appropriately according to the wavelength of light that the waveguide layer 13A guides.

The base surface 11*a* of the substrate 11 and the side surfaces 12*b* and the top surface 12*a* of the mesa 12 are covered with the dielectric layer 14. The dielectric layers 14 are formed in approximately uniformed thicknesses on the base surface 11*a*, the top surface 12*a* and the side surfaces 12*b*. The dielectric layer 14 formed on the base surface 12*b*, the dielectric layer 14 formed on the top surface 12*a* and the dielectric layers 14 formed on the side surfaces 12*b* may have different thicknesses from each another. The dielectric layer 14 is insulative. The dielectric layer 14 may be made of, for example, silicon nitride ($SiN_x$) or silicon dioxide ($SiO_2$).

The electric resistor 15 that is layered is provided at a protrusion end of the mesa 12. The electric resistor 15 may be made of, for example, a material that generates heat by electric conduction, such as an alloy mainly consisting of nickel (Ni) and chrome (Cr). The electric resistor 15 generates heat by a power that is supplied via the conductor layer 16. Thus, the electric resistor 15 may be also referred to as a heater.

The electric resistor 15 includes a top wall 15*a* and two side walls 15*b*.

The top wall 15*a* is provided on the top surface 12*a* of the mesa 12 with the dielectric layer 14 interposed in between. The top wall 15*a* has a certain thickness and an approximately certain width in the Y-direction and extends along the top surface 12*a* of the mesa 12.

The side walls 15*b* are provided on the side surfaces 12*b* of the mesa 12 with the dielectric layer 14 interposed in between. The side wall 15*b* have a certain thickness and an approximately certain width in the Z-direction and extend along the side surfaces 12*b* of the mesa 12 and the end edges 12*a*1 of the top surface 12*a* in the width direction.

In the first embodiment, the top wall 15*a* and the two side walls 15*b* are connected integrally. The top wall 15*a* and the two side walls 15*b* have a shape of U in a cross-section orthogonal to the direction of extension of the mesa 12 and cover the protrusion end of the mesa 12. The top wall 15*a* and the two side walls 15*b* extend along the mesa 12 in the X-direction. In the configuration in which the mesa 12 extends along the base surface 11*a* while curving, the top wall 15*a* and the two side walls 15*b* extend along the mesa 12 while curving, too.

The conductor layer 16 extends in an approximately certain width in the X-direction along the surface of the dielectric layer 14. The conductor layer 16 electrically connected to the electric resistor 15. In the first embodiment, the conductor layer 16 covers the top wall 15*a* and the two side walls 15*b* of the electric resistor 15 on a side opposite to the dielectric layer 14.

The conductor layer 16 is connected to an end of the electric resistor 15 in the X-direction and is electrically connected to a terminal of a power source (not illustrated in the drawings) and functions as a power supply route via which a power is supplied to the electric resistor 15. The conductor layer 16 is made of, for example, a material with conductivity, such as gold (Au).

In the first embodiment, although not illustrated in the drawings, a conductor layer that is electrically connected to another terminal of the power source is connected to an end of the electric resistor 15 in an opposite direction to the X-direction. In other words, the electric resistor 15 is configured such that a current flows in the X-direction or the opposite direction to the X-direction, that is, in the direction in which the mesa 12 extends.

It is possible to make the dielectric layer 14, the electric resistor 15 and the conductor layer 16 by a known semiconductor manufacturing process. Among them, as for the dielectric layer 14 and the electric resistor 15, first of all, the dielectric layer 14 that covers the mesa 12 the base surface 11*a* of the substrate 11 is formed and then, with respect to the dielectric layer 14, an area on a side opposite to the side surfaces 12*b* of the mesa 12 and the base surface 11*a* of the substrate 11 is buried with a resist. The area is buried with the resist such that the dielectric layer 14 that covers a top part of the mesa 12 (the top surface 12*a* and at least part of the side surfaces 12*b* adjacent to the top surface 12*a*) is exposed. The top wall 15*a* and the side walls 15*b* are then formed such that the top wall 15*a* and the side walls 15*b* covers the exposed part of the dielectric layer 14 and thereafter the resist is removed, so that the dielectric layer 14 and the electric resistor 15 are formed.

As described above, in the first embodiment, the semiconductor device 10A includes the substrate 11 (base), the mesa 12 and the electric resistor 15. The substrate 11 has the base surface 11*a*. The mesa 12 protrudes from the substrate 11 in the Z-direction (a first direction) and has the top surface 12*a* and the two side surfaces 12*b* on both sides of the top surface 12*a*. The electric resistor 15 includes the top wall 15*a* that is provided on the top surface 12*a* and the side walls 15*b* that are provided on the side surfaces 12*b* and is configured such that a current flows in the direction in which the mesa 12 extends.

According to such a configuration, the electric resistor 15 includes the side walls 15*b* in addition to the top wall 15*a*. Accordingly, compared to an electric resistor having only a top wall, it is possible to further increase a cross-sectional area of the electric resistor 15 that is orthogonal to the direction in which a current flows through the electric resistor 15. Thus, for example, compared to the case where the same power is supplied to an electric resistor having only the top wall 15*a* and with the same electric resistance, it is possible to further lower a local temperature of the mesa 12 or each part adjacent to the mesa 12, that is, it is possible to inhibit a local and excessive temperature increase and eventually it is possible to increase reliability of the semiconductor device 10A. Note that the direction in which a current flows through the electric resistor 15 is a direction in which the electric resistor 15 and the mesa 12 extend.

In the first embodiment, for example, the electric resistor 15 has the two side walls 15*b* that are provided on both the two side surfaces 12*b*, respectively.

According to such a configuration, for example, compared to the case where the electric resistor 15 has only one side wall 15*b*, a cross-sectional area is further increased easily. Accordingly, for example, a local temperature of the mesa 12 or each part adjacent to the mesa 12 tends to further lower, that is, it is possible to further inhibit a local and excessive temperature increase.

In the first embodiment, for example, the top wall 15*a* and the side walls 15*b* of the electric resistor 15 are adjacent to each other.

According to such a configuration, for example, it is possible to increase thermal conductivity between the top wall 15*a* and the side walls 15*b* and therefore heat generated by the top wall 15*a* is transmitted easily to the base side of the mesa 12 via the side walls 15*b*.

In the first embodiment, for example, the waveguide layer 13A for light is provided in the mesa 12.

The effect of the first embodiment is obtained in the configuration containing the waveguide layer 13A in the mesa 12.

In the first embodiment, for example, the waveguide layer 13A and the side walls 15*b* of the electric resistor 15 are separate in the Z-direction (first direction).

According to such a configuration, for example, it is possible to inhibit leakage of light from the waveguide layer 13A to the side walls 15*b* with relatively high light absorbency.

In the first embodiment, for example, the dielectric layer 14 is present between the waveguide layer 13A and the side walls 15*b*.

According to such a configuration, for example, the dielectric layer 14 makes it possible to inhibit leakage of light from the waveguide layer 13A to the side walls 15*b* with relatively high light absorbency.

In the first embodiment, for example, the dielectric layer 14 is present between the mesa 12 and the side walls 15*b*.

According to such a configuration, for example, the dielectric layer 14 makes it possible to prevent a current from flowing from the side walls 15*b* to the mesa 12.

Modification 1

Figure 2:
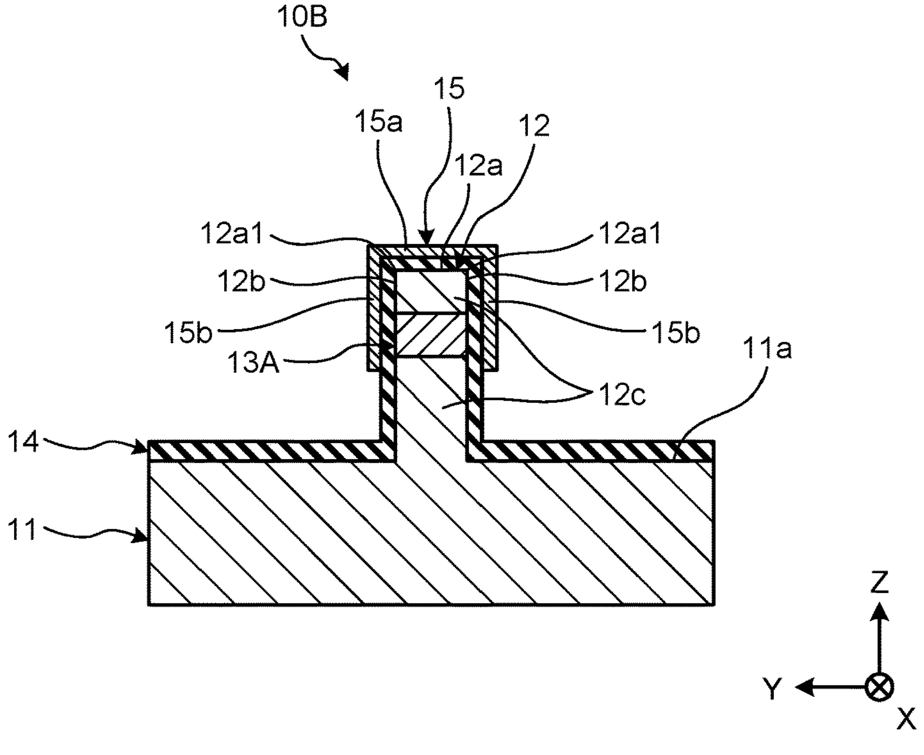
FIG. 2 is an exemplary and schematic cross-sectional view of a semiconductor device of Modification 1 in a position in which a conductor layer is not provided.

FIG. 2 is a cross-sectional view of a semiconductor device 10B of Modification 1 of the first embodiment orthogonal to the X-direction, that is, orthogonal to the direction of extension of the mesa 12 in a position in which the conductor layer 16 is not provided.

As is clear when FIG. 2 is compared to FIG. 1, in the semiconductor device 10B of Modification 1, the length of the side wall 15*b* in the Z-direction is longer than that of the semiconductor device 10A of the first embodiment. Thus, according to Modification 1, it is possible to further increase a cross-sectional area of the electric resistor 15. It is therefore possible to further lower a local temperature of the mesa 12 or each part adjacent to the mesa 12, that is, further inhibit a local and excessive temperature increase and eventually it is possible to further increase reliability of the semiconductor device 10B.

In Modification 1, for example, the waveguide layer 13A and the side walls 15*b* overlap in the Y-direction, that is, the direction of the width of the mesa 12. The dielectric layer 14 is present between the waveguide layer 13A and the side walls 15*b*.

According to such a configuration, for example, in the configuration in which the side walls 15*b* extend to positions in which the side walls 15*b* overlap the waveguide layer 13A in the Y-direction and thus make it possible to further lower a local temperature of the semiconductor device 10B, the dielectric layer 14 makes it possible to inhibit leakage of light from the waveguide layer 13A to the side walls 15*b* with relatively high light absorbency.

The electric resistor 15 may have the cross-sectional shape illustrated in FIG. 2 in the direction in which the mesa 12 extends entirely or may have the cross-sectional shape illustrated in FIG. 2 in a partial section in the direction in which the mesa 12 extends. In Modification 1, the waveguide layer 13A entirely overlaps the side walls 15*b* in the Y-direction; however, the waveguide layer 13A is not limited to this, and the waveguide layer 13A may partly overlap the side walls 15*b* in the Y-direction.

Modification 2

Figure 3:
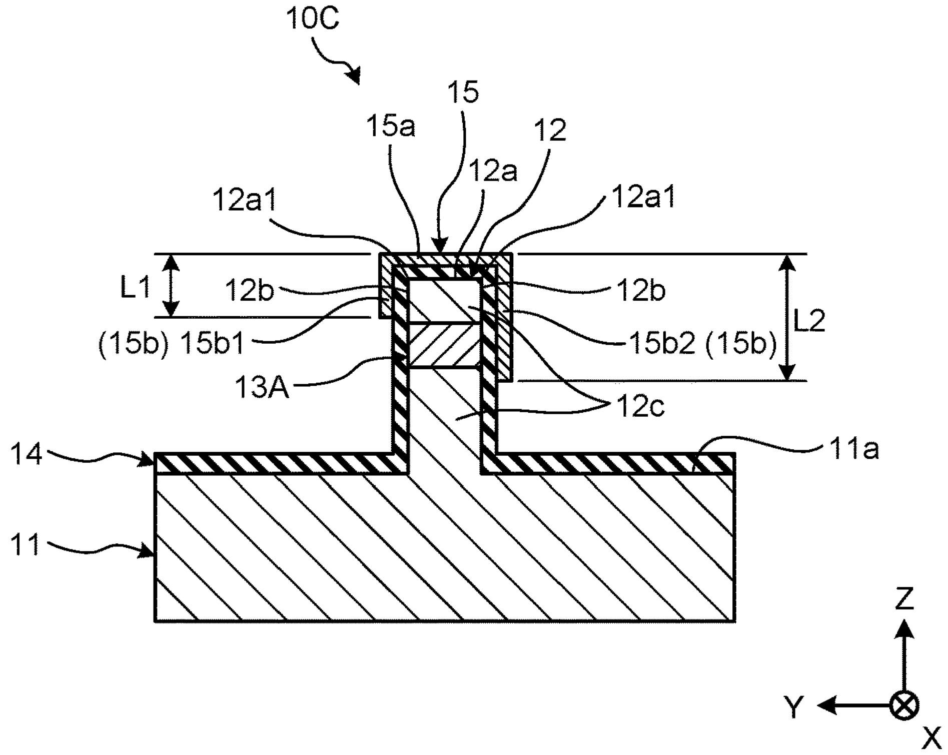
FIG. 3 is an exemplary and schematic cross-sectional view of a semiconductor device of Modification 2 in a position in which a conductor layer is not provided.

FIG. 3 is a cross-sectional view of a semiconductor device 10C of Modification 2 of the first embodiment orthogonal to the X-direction, that is, orthogonal to the direction of extension of the mesa 12 in a position in which the conductor layer 16 is not provided.

In the semiconductor device 100 of Modification 2, in at least a portion having the cross-section in FIG. 3, lengths L1 and L2 of two side walls 15*b*1 and 15*b*2 (15*b*) are different from each other.

Such a mode of the side walls 15*b* would occur, for example, when another portion of the semiconductor device 100 is present near the side wall 15*b*1 (on the left of the mesa 12 in FIG. 3) and the portion serves as a barrier and makes it difficult to form the side wall 15*b*1 long in the Z-direction.

Such a configuration makes it possible to further increase a cross-sectional area of the electric resistor 15, too, because of the side walls 15*b*1 and 15*b*2 and therefore it is possible to further lower a local temperature of the mesa 12 or each part adjacent to the mesa 12, that is, it is possible to inhibit a local and excessive temperature increase and eventually increase reliability of the semiconductor device 100.

The electric resistor 15 may have the cross-sectional shape illustrated in FIG. 3 in the direction in which the mesa 12 extends entirely or may have the cross-sectional shape illustrated in FIG. 3 in a partial section in the direction in which the mesa 12 extends.

Modification 3

Figure 4:
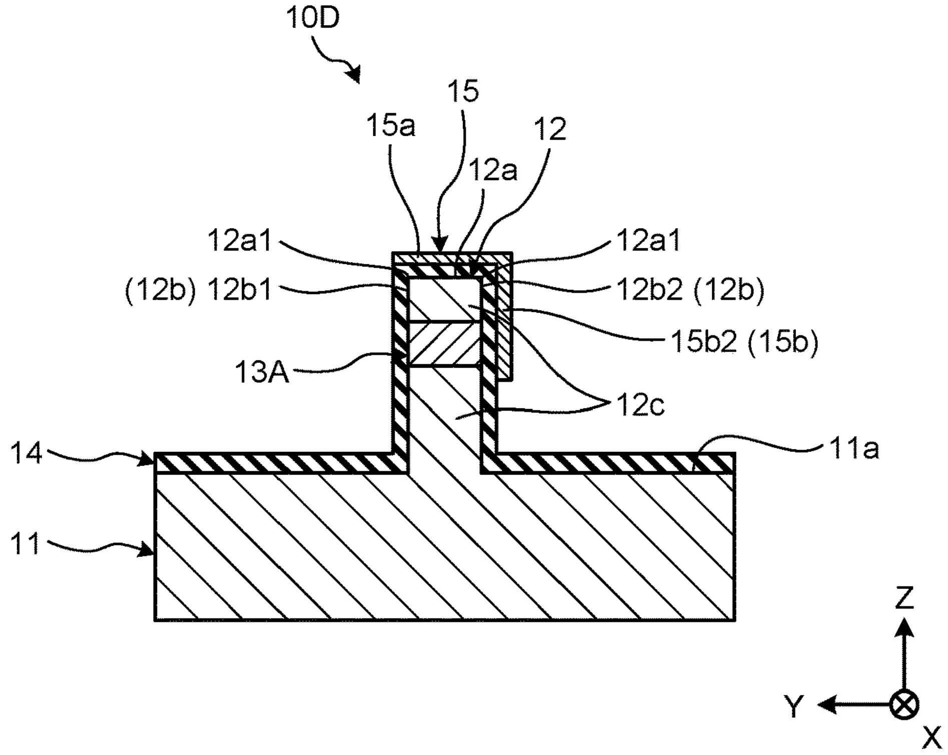
FIG. 4 is an exemplary and schematic cross-sectional view of a semiconductor device of Modification 3 in a position in which a conductor layer is not provided.

FIG. 4 is a cross-sectional view of a semiconductor device 10D of Modification 3 of the first embodiment orthogonal to the X-direction, that is, orthogonal to the direction of extension of the mesa 12 in a position in which the conductor layer 16 is not provided.

As illustrated in FIG. 4, in the semiconductor device 10D of Modification 3, in at least a portion having the cross-section in FIG. 3, the electric resistor 15 has only the side wall 15*b*2 (15*b*) that is provided on the side surface 12*b* that is one of two side surfaces 12*b*1 and 12*b*2 (12*b*) of the mesa 12. In Modification 3, the top wall 15*a* and one of the side walls 15*b* are connected integrally and have a shape of L in a cross-section orthogonal to the direction of extension of the mesa 12, cover one of the end edges 12*a*1 and extend along the mesa 12 in the X-direction.

Such a mode of the side wall 15*b* would occur when another portion of the semiconductor device 10D is present on a side opposite to the side wall 15*b*2 (on the left of the mesa 12 in FIG. 4) and the portion serves as a barrier and makes it difficult to form the side wall 15*b* on the side opposite to the side wall 15*b*2.

Such a configuration makes it possible to further increase a cross-sectional area of the electric resistor 15, too, because of the side wall 15*b*2 and therefore it is possible to further lower a local temperature of the mesa 12 or each part adjacent to the mesa 12, that is, it is possible to inhibit a local and excessive temperature increase and eventually increase reliability of the semiconductor device 10D.

The electric resistor 15 may have the cross-sectional shape illustrated in FIG. 4 in the direction in which the mesa 12 extends entirely or may have the cross-sectional shape illustrated in FIG. 4 in a partial section in the direction in which the mesa 12 extends.

Modification 4

Figure 5:
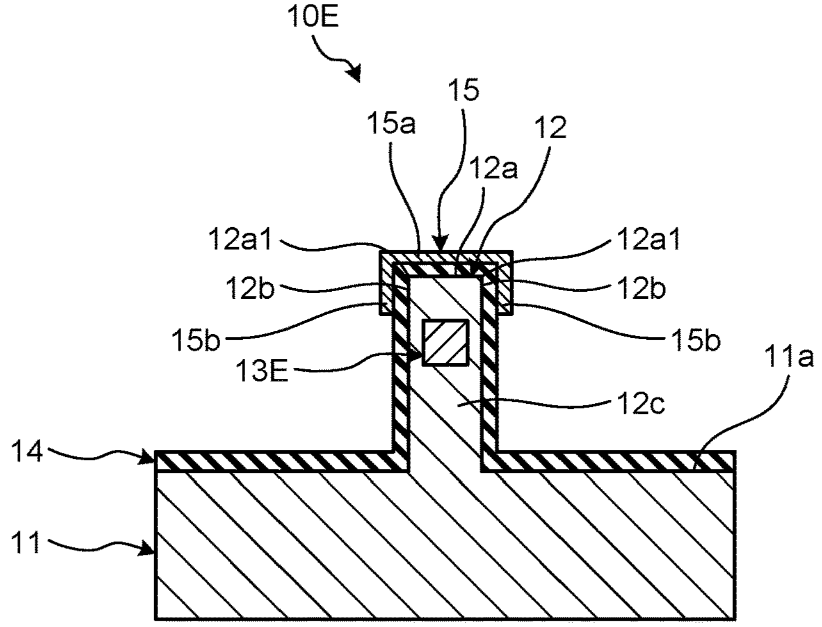
FIG. 5 is an exemplary and schematic cross-sectional view of a semiconductor device of Modification 4 in a position in which a conductor layer is not provided.

FIG. 5 is a cross-sectional view of a semiconductor device 10E of Modification 4 of the first embodiment orthogonal to the X-direction, that is, orthogonal to the direction of extension of the mesa 12 in a position in which the conductor layer 16 is not provided.

As illustrated in FIG. 5, in the semiconductor device 10E of Modification 4, the width of a waveguide layer 13E is shorter than the width of the mesa 12 and both sides of the waveguide layer 13E in the width direction (Y-direction) are covered with the cladding layer 12*c* of the mesa 12. In other words, the semiconductor device 10E has a so-called burying-mesa configuration.

Such a configuration makes it possible to further increase a cross-sectional area of the electric resistor 15, too, because the electric resistor 15 has the side walls 15*b* and therefore it is possible to further lower a local temperature of the mesa 12 or each part adjacent to the mesa 12, that is, it is possible to inhibit a local and excessive temperature increase and eventually increase reliability of the semiconductor device 10E.

Modification 5

Figure 6:
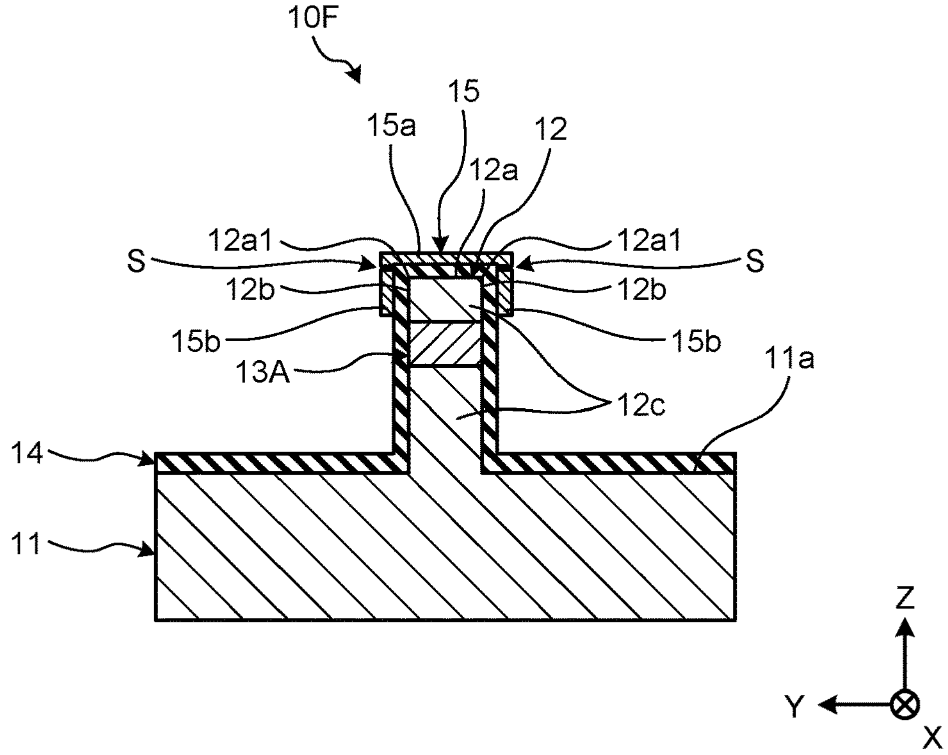
FIG. 6 is an exemplary and schematic cross-sectional view of a semiconductor device of Modification 5 in a position in which a conductor layer is not provided.

FIG. 6 is a cross-sectional view of a semiconductor device 10F of Modification 5 of the first embodiment orthogonal to the X-direction, that is, orthogonal to the direction of extension of the mesa 12 in a position in which the conductor layer 16 is not provided.

As illustrated in FIG. 6, in the semiconductor device 10F of Modification 5, a slit S (gap) extending along the mesa 12 is provided between the top wall 15*a* and the two side walls 15*b*. In a section in which the slit S is provided, the top wall 15*a* and the two side walls 15*b* do not make contact with each another. Note that the top wall 15*a* and the two side walls 15*b* are connected in parallel with the same terminal of the power source (not illustrated in FIG. 6). In other words, the top wall 15*a* and the two side walls 15*b* are connected electrically.

Such a configuration makes it possible to further increase a cross-sectional area of the electric resistor 15, too, because the electric resistor 15 has the side walls 15*b* and therefore it is possible to further lower a local temperature of the mesa 12 or each part adjacent to the mesa 12, that is, it is possible to inhibit a local and excessive temperature increase and eventually increase reliability of the semiconductor device 10F.

The slit S may be provided over the whole length of the electric resistor 15 or may be provided in a partial section of the electric resistor 15. In Modification 5, the slit S extends in the Y-direction in the cross-section in FIG. 6; however, the slit S is not limited to this, and the slit S may extend in the Z-direction or a direction between the Z-direction and the Y-direction (or the direction opposite to the Y-direction). The position of the slit S is not limited to the position in Modification 5.

Modification 6

Figure 7:
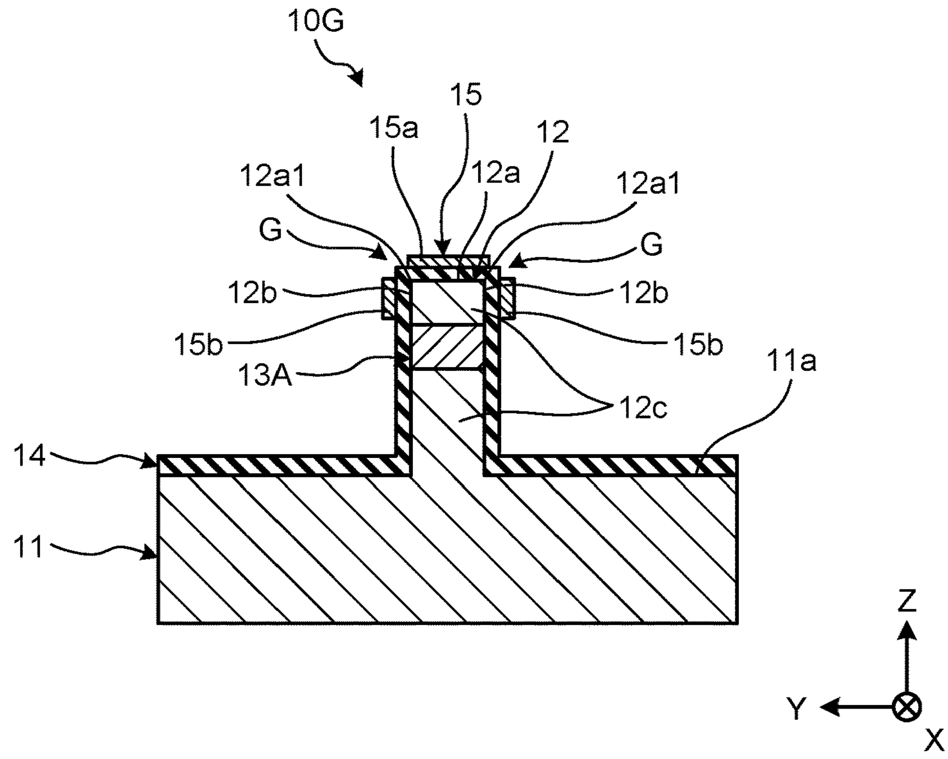
FIG. 7 is an exemplary and schematic cross-sectional view of a semiconductor device of Modification 6 in a position in which a conductor layer is not provided.

FIG. 7 is a cross-sectional view of a semiconductor device 10G of Modification 6 of the first embodiment orthogonal to the X-direction, that is, orthogonal to the direction of extension of the mesa 12 in a position in which the conductor layer 16 is not provided.

As illustrated in FIG. 7, in the semiconductor device 10G of Modification 6, a gap G extending along the mesa 12 is provided between the top wall 15*a* and the two side walls 15*b*. In a section in which the gap G is provided, the top wall 15*a* and the two side walls 15*b* are more separated from each other than in Modification 5 and do not make contact with each another. Note that, also in Modification 6, the top wall 15*a* and the two side walls 15*b* are connected in parallel with the same terminal of the power source (not illustrated in FIG. 7). In other words, the top wall 15*a* and the two side walls 15*b* are connected electrically.

Such a configuration makes it possible to further increase a cross-sectional area of the electric resistor 15, too, because the electric resistor 15 has the side walls 15*b* and therefore it is possible to further lower a local temperature of the mesa 12 or each part adjacent to the mesa 12, that is, it is possible to inhibit a local and excessive temperature increase and eventually increase reliability of the semiconductor device 10G.

The gap G may be provided over the whole length of the electric resistor 15 or may be provided in a partial section of the electric resistor 15. The position of the gap G is not limited to the position in Modification 6.

Modification 7

Figure 8:
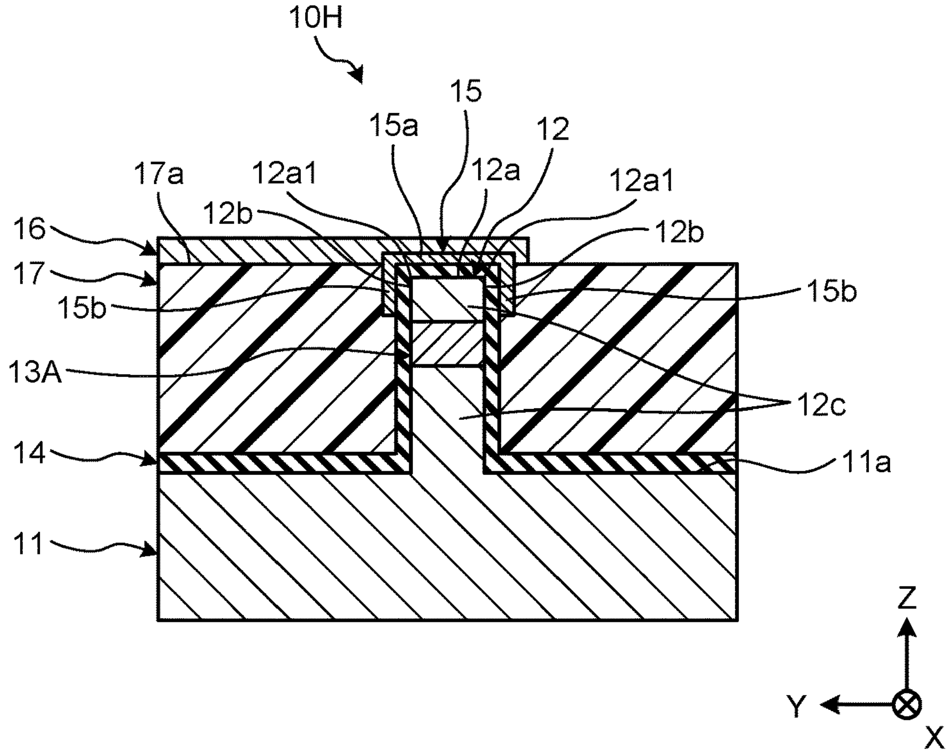
FIG. 8 is an exemplary and schematic cross-sectional view of a semiconductor device of Modification 7 in a position in which a conductor layer is provided.

FIG. 8 is a cross-sectional view of a semiconductor device 10H of Modification 7 of the first embodiment orthogonal to the X-direction, that is, orthogonal to the direction of extension of the mesa 12 in a position in which the conductor layer 16 is not provided.

As illustrated in FIG. 8, the semiconductor device 10H of Modification 7 includes a burying layer 17 adjacent to the mesa 12. On an area in which the mesa 12 is not provided in the substrate 11, the burying layer 17 extends in the X-direction and the Y-direction in an approximately certain height in the Z-direction from the base surface 11*a*. Note that the dielectric layer 14 is present between the substrate 11 and the mesa 12 and the burying layer 17.

The height of the burying layer 17 in the Z-direction is set such that part of the electric resistor 15 is exposed. In Modification 7, the top wall 15*a* of the electric resistor 15 is exposed from the burying layer 17. A top surface 17*a* of the burying layer 17 is set such that the top surface 17*a* overlaps the top wall 15*a* of the electric resistor 15 or a portion of the side wall 15*b* near the top wall 15*a* in the Y-direction, that is, the direction of the width of the mesa 12.

The burying layer 17 is made of an insulating material. Specifically, the burying layer 17 may be made of, for example, a synthetic resin material that is insulative, such as polyimide. The burying layer 17 may be also referred to as an insulating layer or a reinforcing layer.

The conductor layer 16 is provided on the burying layer 17. A cross-section of the semiconductor device 10H in a position in which the conductor layer 16 is not provided has a shape obtained by excluding the conductor layer 16 from FIG. 8.

As described above, in Modification 7, the semiconductor device 10H includes the burying layer 17 that is adjacent to the mesa 12 on the substrate 11 (base).

According to such a configuration, for example, it is possible to increase protection of the mesa 12 and increase rigidity of the semiconductor device 10H.

In Modification 7, the conductor layer 16 is provided on the burying layer 17.

According to such a configuration, for example, it is possible to reduce a difference in height in the Z-direction between a portion of the conductor layer 16 on the mesa 12 and a portion of the conductor layer 16 on the substrate 11. Accordingly, for example, an advantage that it is possible to form the conductor layer 16 more easily and an advantage that it is possible to further reduce the volume of the conductor layer 16 are obtained.

Moreover, according to such a configuration, for example, the thickness of the dielectric layer 14 between the heater and the mesa 12 is reduced, and therefore, the increase in the temperature by the heat generation of the heater is lowered, and the reliability is improved.

Modification 8

Figure 9:
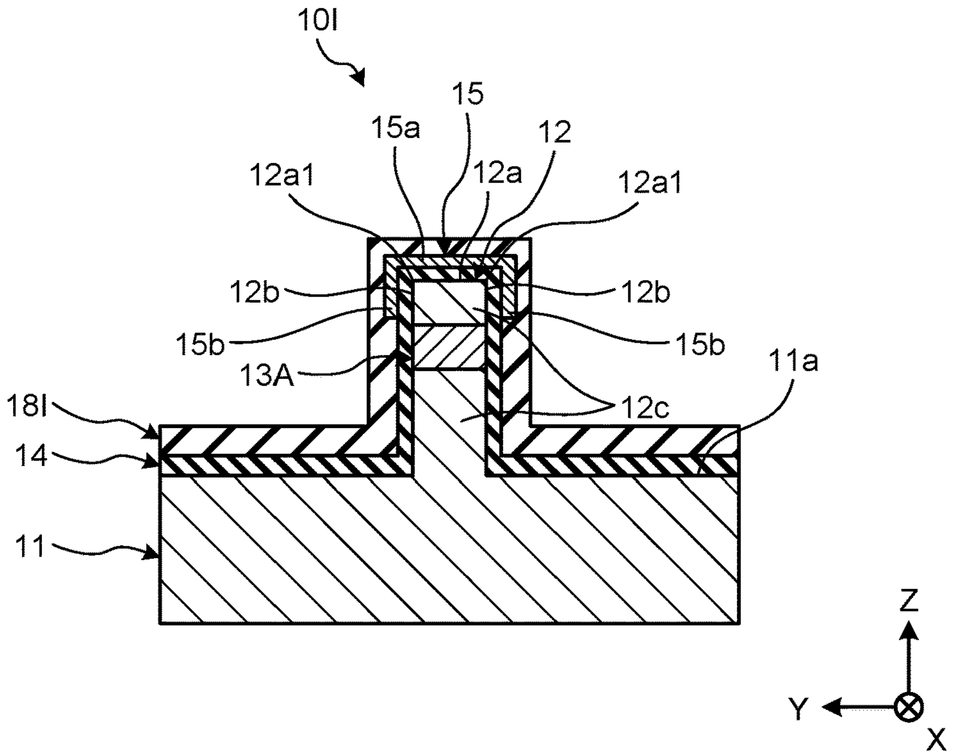
FIG. 9 is an exemplary and schematic cross-sectional view of a semiconductor device of Modification 8 in a position in which a conductor layer is not provided.
Figure 10:
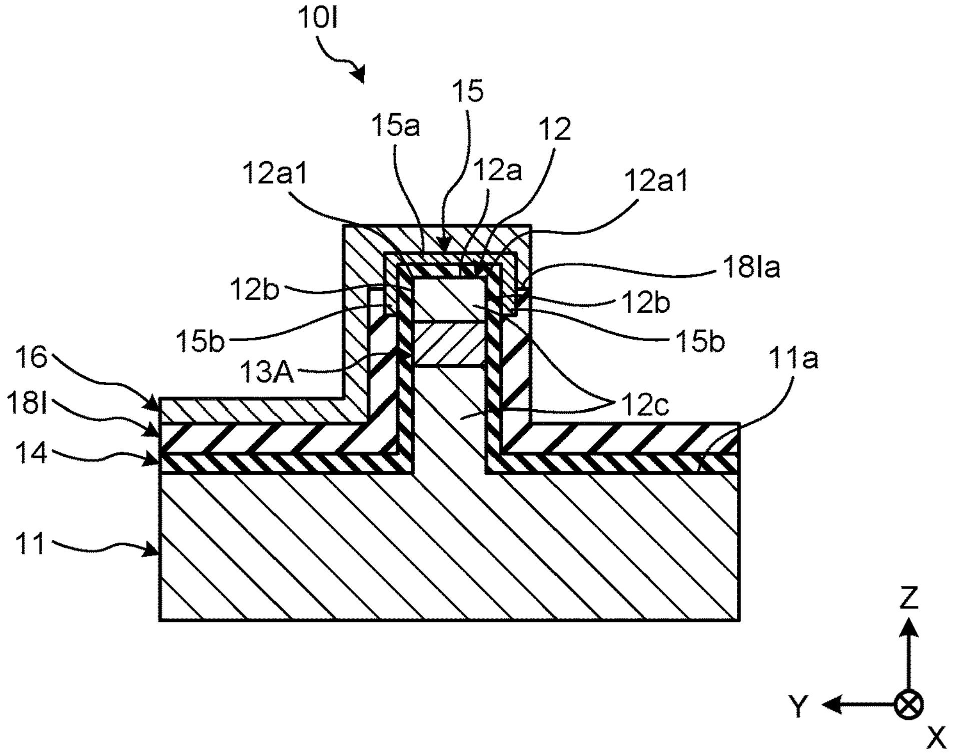
FIG. 10 is an exemplary and schematic cross-sectional view of the semiconductor device of Modification 8 in a position in which the conductor layer is provided.

FIG. 9 is a cross-sectional view of a semiconductor device 10I of Modification 8 of the first embodiment orthogonal to the X-direction, that is, orthogonal to the direction of extension of the mesa 12 in a position in which the conductor layer 16 is not provided. FIG. 10 is a cross-sectional view of the semiconductor device 10I orthogonal to the X-direction, that is, orthogonal to the direction of extension of the mesa 12 in a position in which the conductor layer 16 is provided.

As illustrated in FIG. 9, the semiconductor device 10I of Modification 8 includes a protective layer 181 that covers the electric resistor 15 and the dielectric layer 14. The protective layer 181 covers the electric resistor 15 on a side opposite to the mesa 12.

As illustrated in FIG. 10, an opening 181*a* that partly exposes the electric resistor 15 is provided in the protective layer 181 in a position in which the conductor layer 16 is provided. The conductor layer 16 covers the electric resistor 15 and the protective layer 181 on a side opposite to the substrate 11 and the mesa 12 and penetrates such that the opening 18Ia is filled and is connected to the electric resistor 15.

The protective layer 181 may be made of a dielectric, such as silicon nitride or silicon dioxide. The protective layer 181 may be also referred to as a dielectric layer or an insulating layer. The protective layer 181 is an example of a second protective layer.

As described above, in Modification 8, the protective layer 181 covers the electric resistor 15.

According to such a configuration, for example, it is possible to increase protection of the electric resistor 15.

In Modification 8, the opening 181*a* that partly exposes the electric resistor 15 is provided in the protective layer 181 and the conductor layer 16 covers the protective layer 181 on the side opposite to the mesa 12 and penetrates such that the opening 181*a* is filled and is electrically connected to the electric resistor 15.

According to such a configuration, for example, even in the configuration in which the electric resistor 15 is covered with the protective layer 181, it is possible to electrically connect the conductor layer 16 and the electric resistor 15 via the opening 18Ia. Forming the opening 18Ia makes it possible to cover the electric resistor 15 with the conductor layer 16 with which the opening 18Ia is filled even in the portion lacking the protective layer 181. Accordingly, it is possible to protect the electric resistor 15 more assuredly.

Modification 9

Figure 11:
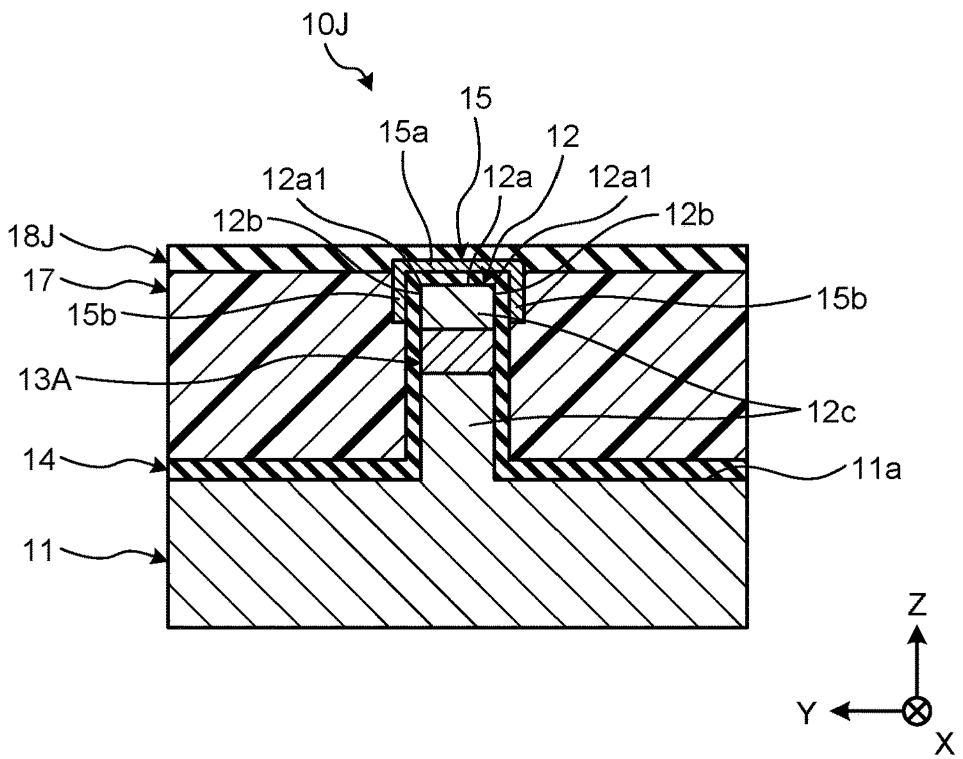
FIG. 11 is an exemplary and schematic cross-sectional view of a semiconductor device of Modification 9 in a position in which a conductor layer is not provided.
Figure 12:
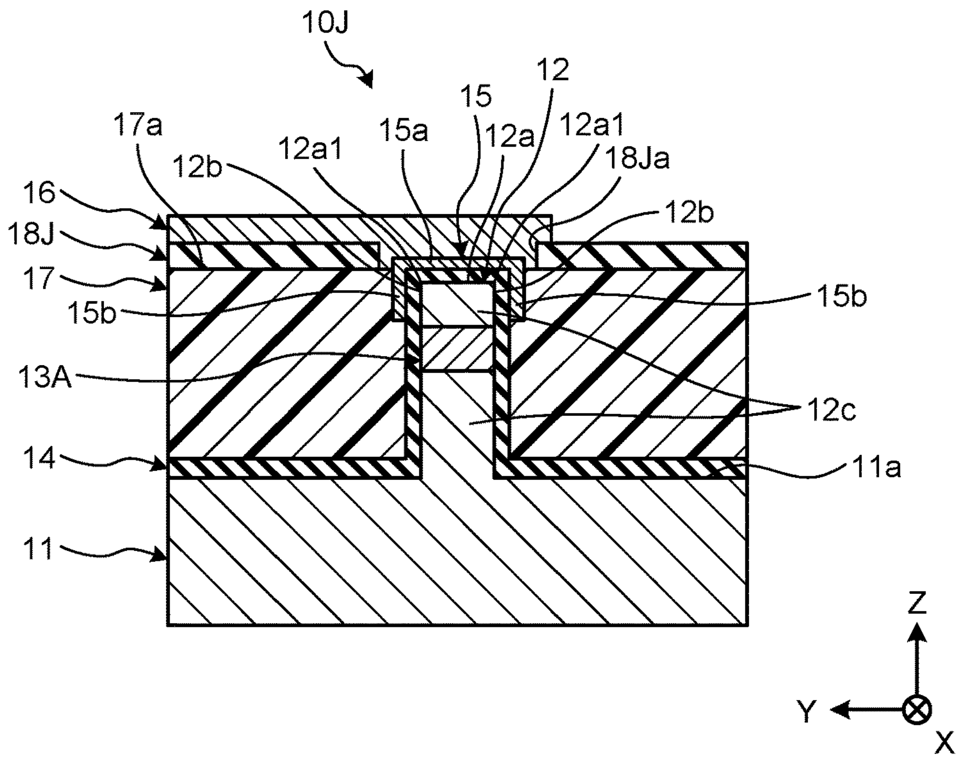
FIG. 12 is an exemplary and schematic cross-sectional view of the semiconductor device of Modification 9 in a position in which the conductor layer is provided.

FIG. 11 is a cross-sectional view of a semiconductor device 10J of Modification 9 of the first embodiment orthogonal to the X-direction, that is, orthogonal to the direction of extension of the mesa 12 in a position in which the conductor layer 16 is not provided. FIG. 12 is a cross-sectional view of the semiconductor device 10J orthogonal to the X-direction, that is, orthogonal to the direction of extension of the mesa 12 in a position in which the conductor layer 16 is provided.

As illustrated in FIGS. 11 and 12, the semiconductor device 10J of Modification 9 includes the same burying layer 17 (refer to FIG. 8) as that of Modification 7.

As illustrated in FIG. 11, the semiconductor device 10J includes a protective layer 18J that covers the electric resistor 15 and the burying layer 17. The protective layer 18J covers the electric resistor 15 and the burying layer 17 on a side opposite to the substrate 11 and the mesa 12.

As illustrated in FIG. 12, an opening 18Ja that partly exposes the electric resistor 15 is provided in the protective layer 18J in a position in which the conductor layer 16 is provided. The conductor layer 16 covers the protective layer 18J on a side opposite to burying layer 17 and penetrates such that the opening 18Ja is filled and is connected to the electric resistor 15.

The protective layer 18J may be made of a dielectric, such as silicon nitride or silicon dioxide. The protective layer 18J may be also referred to as a dielectric layer or an insulating layer. The protective layer 18J is an example of a first protective layer.

As described above, in Modification 9, the protective layer 18J covers the electric resistor 15 and the burying layer 17.

According to such a configuration, it is possible to increase protection of the electric resistor 15 even in, for example, the semiconductor device 10J including the burying layer 17.

In Modification 9, the opening 18Ja that partly exposes the electric resistor 15 is provided in the protective layer 18J and the conductor layer 16 covers the protective layer 18J on the side opposite to the burying layer 17 and penetrates the opening 18Ja and is electrically connected to the electric resistor 15.

According to such a configuration, for example, even in the configuration in which the electric resistor 15 is covered with the protective layer 18J, it is possible to electrically connect the conductor layer 16 and the electric resistor 15 via the opening 18Ja. Forming the opening 18Ja makes it possible to cover the electric resistor 15 with the conductor layer 16 with which the opening 18Ja is filled even in the portion lacking the protective layer 18J. Accordingly, it is possible to protect the electric resistor 15 more assuredly.

Moreover, according to such a configuration, for example, the thickness of the dielectric layer 14 between the heater and the mesa 12 is reduced, and therefore, the increase in the temperature by the heat generation of the heater is lowered, and the reliability is improved.

Modification 10

Figure 13:
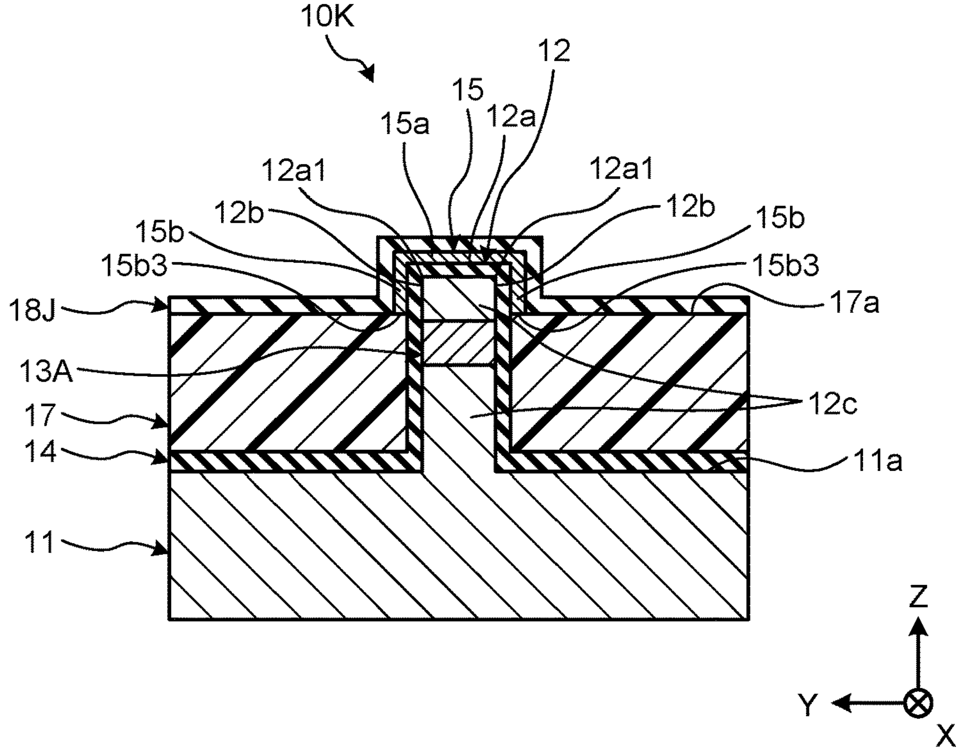
FIG. 13 is an exemplary and schematic cross-sectional view of a semiconductor device of Modification 10 in a position in which a conductor layer is not provided.

FIG. 13 is a cross-sectional view of a semiconductor device 10K of Modification 10 of the first embodiment orthogonal to the X-direction, that is, orthogonal to the direction of extension of the mesa 12 in a position in which the conductor layer 16 is not provided.

As illustrated in FIG. 13, the semiconductor device 10K of Modification 10 includes the same burying layer 17 (refer to FIG. 8) as that of Modification 7.

Note that, in Modification 10, the side walls 15*b* of the electric resistor 15 are provided on an upper side with respect to the top surface 17*a* of the burying layer 17. In other words, an end 15*b*3 of the side wall 15*b* in a direction opposite to the Z-direction makes contact with the top surface 17*a* in the Z-direction and the side wall 15*b* extends from the end 15*b*3 in the Z-direction.

Also in Modification 10, the protective layer 18J covers the electric resistor 15 and the burying layer 17 on a side opposite to the substrate 11 and the mesa 12.

As described above, in Modification 10, the side walls 15*b* are provided on the upper side with respect to the burying layer 17.

According to such a configuration, for example, it is possible to, after forming the burying layer 17, form the electric resistor 15 on the top surface 17*a* of the burying layer 17 more easily. Thus, it is possible to further reduce the time and cost of manufacturing the semiconductor device 10K including the burying layer 17.

Modification 11

Figure 14:
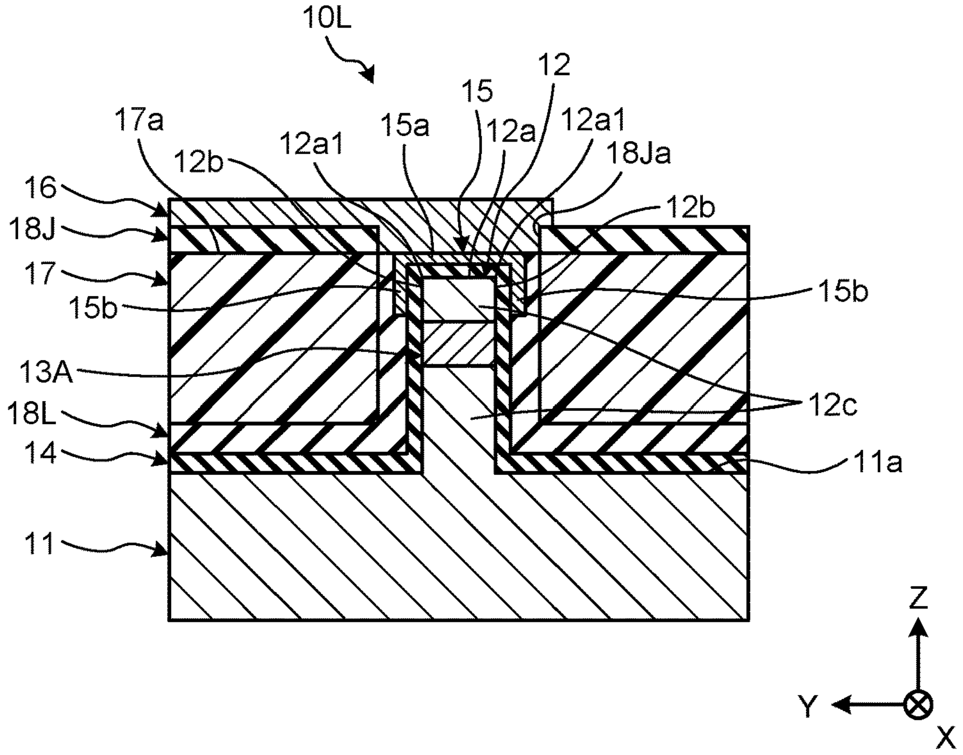
FIG. 14 is an exemplary and schematic cross-sectional view of a semiconductor device of Modification 11 in a position in which a conductor layer is provided.

FIG. 14 is a cross-sectional view of a semiconductor device 10L of Modification 11 of the first embodiment orthogonal to the X-direction, that is, orthogonal to the direction of extension of the mesa 12 in a position in which the conductor layer 16 is provided.

As illustrated in FIG. 14, the semiconductor device 10L of Modification 11 has a configuration in which a protective layer 18L is present between the dielectric layer 14 and the electric resistor 15 and the burying layer 17.

The protective layer 18L may be made of a dielectric, such as silicon nitride or silicon dioxide. The protective layer 18L is an example of the second protective layer. The protective layer 18L may be also referred to as a dielectric layer or an insulating layer.

According to such a configuration, for example, the protective layer 18L makes it possible to inhibit transmission of heat from the electric resistor 15 to the burying layer 17 and increase protection of the burying layer 17 from the heat that is generated in the electric resistor 15. Furthermore, the protective layer 18L makes it possible to increase adhesion between the dielectric layer 14 and the electric resistor 15 and the burying layer 17.

Modification 12

Figure 15:
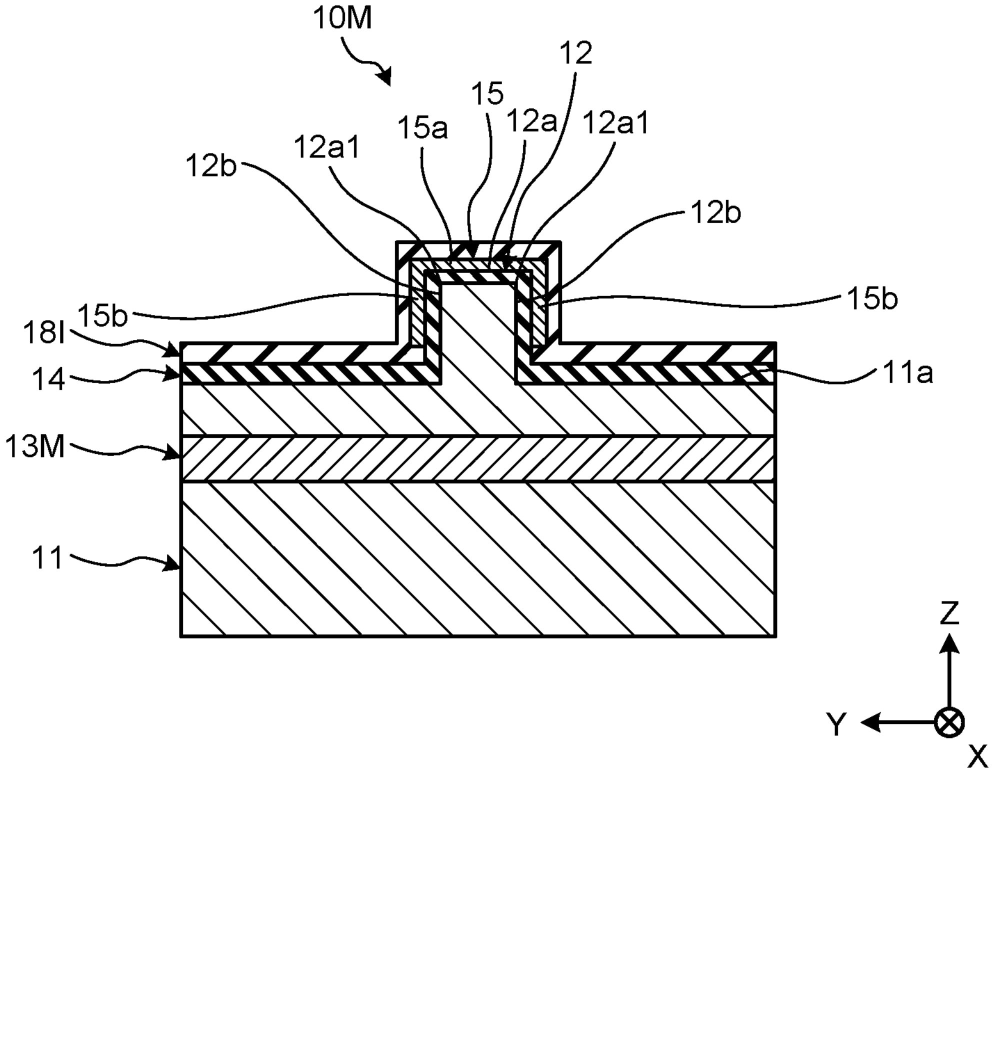
FIG. 15 is an exemplary and schematic cross-sectional view of a semiconductor device of Modification 12 in a position in which a conductor layer is not provided.

FIG. 15 is a cross-sectional view of a semiconductor device 10M of Modification 12 of the first embodiment orthogonal to the X-direction, that is, orthogonal to the direction of extension of the mesa 12 in a position in which the conductor layer 16 is not provided.

As illustrated in FIG. 15, in Modification 12, a waveguide layer 13M is provided in the substrate 11 that is apart from the mesa 12 in a direction opposite to the Z-direction. The semiconductor device 10M has a so-called low-mesa configuration. Because of the mesa 12, light is confined in an area in the waveguide layer 13M positioned oppositely to the mesa 12 in a direction opposite to the Z-direction and is guided.

As in the first embodiment, the mesa 12 is covered with the dielectric layer 14. The top wall 15*a* of the electric resistor 15 is provided on the top surface 12*a* of the mesa 12 via the dielectric layer 14 and the side walls 15*b* of the electric resistor 15 are provided on the side surfaces 12*b* of the mesa 12 via the dielectric layer 14. As in Modification 8, the semiconductor device 10M includes a protective layer 181 that covers the electric resistor 15 and the dielectric layer 14.

Such a configuration makes it possible to further increase a cross-sectional area of the electric resistor 15, too, because the electric resistor 15 has the side walls 15*b* and therefore it is possible to further lower a local temperature of the mesa 12 or each part adjacent to the mesa 12, that is, it is possible to inhibit a local and excessive temperature increase and eventually increase reliability of the semiconductor device 10M.

Second Embodiment

Figure 16:
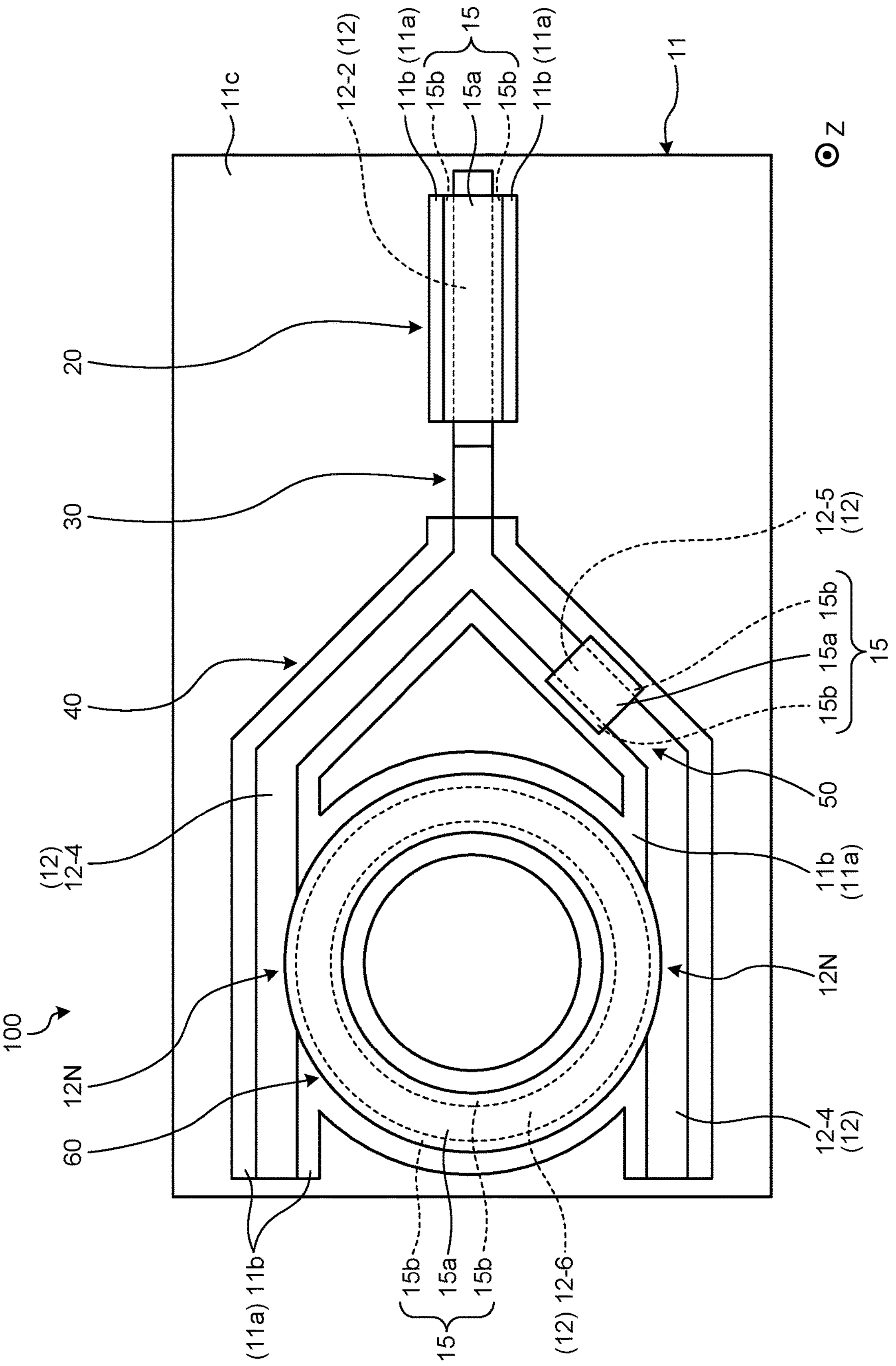
FIG. 16 is an exemplary and schematic plane view of a semiconductor device of a second embodiment.

FIG. 16 is a plane view of a semiconductor device 100 of a second embodiment. The semiconductor device 100 is configured as a wavelength-tunable semiconductor laser device utilizing the vernier effect like that disclosed in International Publication Pamphlet No. WO 2018/147307. The semiconductor device 100 includes semiconductor devices 20, 30, 40, 50 and 60 that are integrated on the common substrate 11. In FIG. 16, illustration of waveguide layers 13A, 13E and 13M, the dielectric layer 14, the conductor layer 16 and the protective layers 181, 18J and 18L, etc., is omitted.

The semiconductor device 20 includes a linear mesa 12-2 (12). The mesa 12-2 has a semiconductor layered configuration containing a DBR (distributed bragg reflector) diffraction grating layer containing a sampled grating and a waveguide layer. The semiconductor device 20 has a reflection spectrum characteristics with comb peaks and forms one of reflectors of a laser resonator.

In the semiconductor device 20, two trenches lib with an interval in between are formed on a surface 11$c$ of the substrate 11 and the mesa 12-2 that protrudes from bottom surfaces of the trenches lib in a Z-direction is provided between the two trenches lib. The bottom surfaces of the trenches lib are an example of the base surface 11$a$ of the substrate 11.

The semiconductor device 20 includes the electric resistor 15. As in the above-described embodiment and modifications, the electric resistor 15 includes the top wall 15$a$ and the side walls 15$b$ and extends along the mesa 12-2. Causing the electric resistor 15 to generate heat by electric conduction and thus heating the mesa 12-2 enables an overall shift of a reflection peak wavelength on an axis of wavelength.

The semiconductor device 30 has a burying-mesa semiconductor layered configuration containing an active layer serving as an optical waveguide area. The active layer is optically connected to the waveguide layer of the semiconductor device 20 and electric conduction is enabled by electrodes (not illustrated in FIG. 16) provided in the semiconductor device 30 to generate an optical gain.

The semiconductor device 40 includes a mesa 12-4 (12). The mesa 12-4 has an appearance of a Y-shape and a polygonal chain on a plane view. The mesa 12-4 has a semiconductor-layered configuration containing a waveguide layer. The waveguide layer on one end of the mesa 12-4 is optically connected to the active layer of the semiconductor device 30 and extends apart from the semiconductor device 30. The mesa 12-4 bifurcates into two arms at a multi-mode interference (MMI) unit that is present in the middle and has the other end of each of the arms on a side opposite to the semiconductor device 30.

Also in the semiconductor device 40, as in the semiconductor device 20, the two trenches 11$b$ with an interval in between are formed on the surface 11$c$ of the substrate 11 and the mesa 12-4 protruding from the bottom surfaces of the trenches 11$b$ serving as the base surface 11$a$ in the Z-direction is provided between these two trenches 11$b$.

The semiconductor device 50 forms part of the semiconductor device 40. The semiconductor device 50 includes a mesa 12-5 (12) as part of one of the arms in the mesa 12-4 (12).

Also in the semiconductor device 50, as in the semiconductor devices 20 and 40, the two trenches lib with an interval in between are formed on the surface 11$c$ of the substrate 11 and the mesa 12-5 protruding from the bottom surfaces of the trenches 11$b$ serving as the base surface 11$a$ in the Z-direction is provided between these two trenches 11$b$.

The semiconductor device 50 includes the electric resistor 15. As in the above-described embodiment and modifications, the electric resistor 15 includes the top wall 15$a$ and the side walls 15$b$ and extends along the mesa 12-5. Causing the electric resistor 15 to generate heat by electric conduction and thus heating the mesa 12-5 enables a change in optical path length of a waveguide layer in the mesa 12-5 and eventually enables a change in resonator length of the laser resonator.

The semiconductor device 60 includes a mesa 12-6 (12). The mesa 12-6 has an appearance of a ring-like shape. The mesa 12-6 is a ring resonator having a semiconductor layered configuration containing a waveguide layer.

The semiconductor devices 40, 50 and 60 have reflection spectrum characteristics with comb-like peaks in a period different from that of the semiconductor device 20 with respect to light that is input from the semiconductor device 30 and form the other reflector of the laser resonator.

The waveguide layer of the mesa 12-6 is optically connected to each of the optical waveguide paths of the two arms of the mesa 12-4 of the semiconductor device 40.

Also in the semiconductor device 60, as in the semiconductor devices 20, 40 and 60, the two trenches lib with an interval in between are formed on the surface 11$c$ of the substrate 11 and the mesa 12-6 protruding from the bottom surfaces of the trenches 11$b$ serving as the base surface 11$a$ in the Z-direction is provided between these two trenches lib.

The semiconductor device 60 includes the electric resistor 15. As in the above-described embodiment and modifications, the electric resistor 15 includes the top wall 15$a$ and the side walls 15$b$ and extends along the mesa 12-6. Causing the electric resistor 15 to generate heat by electric conduction and thus heating the mesa 12-6 enables an overall shift of a reflection peak wavelength on an axis of wavelength.

In a portion 12N of connection with the mesa 12-4, because the mesa 12-6 does not have the side surface 12$b$ on the side of the mesa 12-4, that is, on a circumferential side, the electric resistor 15 includes the top wall 15$a$ and the side wall 15$b$ on the side opposite to the mesa 12-4. In other words, the electric resistor 15 has a shape of L partly in a cross section orthogonal to the direction of extension of the mesa 12-4. In the general portion excluding the portion 12N of connection with the trenches 11$b$ on both sides, the electric resistor 15 has the top wall 15$a$ and the two side walls 15$b$.

The above-described semiconductor device 100 is able to function as a wavelength-tunable semiconductor laser device utilizing the vernier effect by adjusting power supplied to each of the electric resistors 15 that are provided in the semiconductor devices 20, 50 and 60.

Also according to the semiconductor device 100 according to the second embodiment, as in the above-described embodiment and modifications, it is possible to obtain the effect of the electric resistor 15 having the top wall 15$a$ and the side walls 15$b$.

Modification 13

Figure 17:
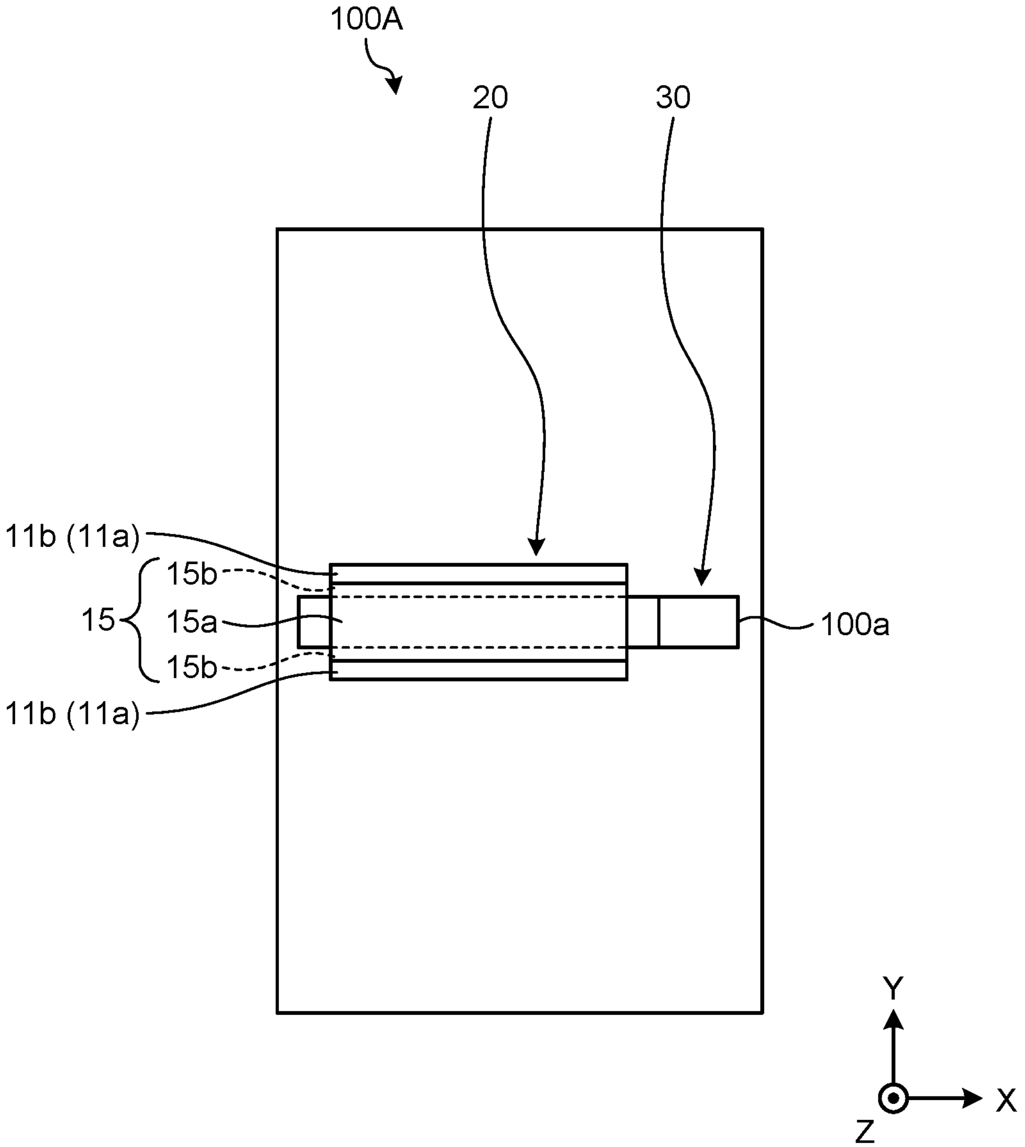
FIG. 17 is an exemplary and schematic plane view of a semiconductor device of Modification 13.

FIG. 17 is a plane a plane view of a semiconductor device 100A of Modification 13 serving as a modification of the second embodiment. In FIG. 17, illustration of the waveguide layers 13A, 13E and 13M, the dielectric layer 14, the conductor layer 16, the protective layers 181, 18J and 18L, etc., is omitted.

The semiconductor device 100A includes the same semiconductor devices 20 and 30 as those of the second embodiment. In other words, the semiconductor device 20 has a reflection spectrum characteristics with comb peaks and forms one of reflectors of a laser resonator. The semiconductor device 30 generates an optical gain.

The semiconductor device 100A has a reflection surface 100$a$ as the other reflector of the laser resonator.

The semiconductor device 100A of the present Modification having the configuration above may function as a laser device.

Also according to the semiconductor device 100A f the present Modification, as in the above-described embodiments and modifications, it is possible to obtain the effect of the electric resistor 15 having the top wall 15$a$ and the side walls 15$b$.

The embodiments and the modifications of the disclosure have been exemplified and the embodiments and the modifications described above are an example and are not intended to limit the scope of the disclosure. The above-described embodiments and modifications may be carried out in other various modes and various types of omission, replacement, combination and change may be made without departing from the scope of the disclosure. Specification, such as each configuration and the shape, (the configuration, type, direction, model, size, length, width, thickness, height, number, arrangement, position, and material) may be changed as appropriate and enabled.

According to the disclosure, for example, in a semiconductor device including a heater on a mesa, it is possible to inhibit a local and excessive temperature increase.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor device comprising:

a base including a base surface;

a mesa protruding from the base surface in a first direction intersecting the base surface, the mesa including a top surface and two side surfaces on both sides of the top surface, and extending along the base surface; and an electric resistor including only a top wall provided on the top surface and a side wall provided on at least one of the two side surfaces, the electric resistor being configured such that a current flows in an extending direction of the mesa, wherein the side wall of the electric resistor is not extended to a bottom edge of the mesa and the electric resistor is not provided on the bottom edge of the mesa.

2. The semiconductor device according to claim 1, wherein the electric resistor includes, as the side wall, two side walls provided on the two side surfaces, respectively.

3. The semiconductor device according to claim 2, wherein the electric resistor includes a portion in which lengths of the two side walls in the first direction are different from each other in a cross-section orthogonal to the extending direction of the mesa.

4. The semiconductor device according to claim 1, wherein the electric resistor includes a portion in which only one side wall provided on one of the two side surfaces is provided as the side wall in a cross-section orthogonal to the extending direction of the mesa.

5. The semiconductor device according to claim 1, wherein the top wall and the side wall make contact with each other.

6. The semiconductor device according to claim 1, wherein the top wall and the side wall are separated from each other.

7. The semiconductor device according to claim 1, further comprising a waveguide layer for light in the mesa.

8. The semiconductor device according to claim 7, wherein the waveguide layer and the side wall are separated from each other in the first direction.

9. The semiconductor device according to claim 7, further comprising a dielectric layer between the waveguide layer and the side wall.

10. The semiconductor device according to claim 7, wherein the waveguide layer and the side wall overlap at least partly in a second direction orthogonal to the first direction, and the semiconductor device further comprises a dielectric layer between the waveguide layer and the side wall.

11. The semiconductor device according to claim 1, further comprising a waveguide layer for light in the base separated from the mesa in a direction opposite to the first direction.

12. The semiconductor device according to claim 1, further comprising a burying layer on the base, the burying layer being adjacent to the mesa and being made of an insulating material.

13. The semiconductor device according to claim 12, further comprising a conductor layer on the burying layer, the conductor layer being connected to the top wall.

14. The semiconductor device according to claim 12, further comprising a first protective layer configured to cover the electric resistor and the burying layer.

15. The semiconductor device according to claim 14, further comprising a conductor layer on the burying layer, the conductor layer being connected to the top wall, wherein an opening that partly exposes the electric resistor is provided in the first protective layer, and the conductor layer covers the first protective layer and penetrates the opening.

16. The semiconductor device according to claim 12, further comprising a second protective layer that is present between the electric resistor and the burying layer.

17. The semiconductor device according to claim 1, further comprising an insulating layer between the mesa and the side wall.

18. The semiconductor device according to claim 12, wherein the side wall is provided on an upper side with respect to the burying layer.

* * * * *